(12) United States Patent
Bianchi

(10) Patent No.: US 7,480,604 B2
(45) Date of Patent: Jan. 20, 2009

(54) METHOD OF MODELING AND PRODUCING AN INTEGRATED CIRCUIT INCLUDING AT LEAST ONE TRANSISTOR AND CORRESPONDING INTEGRATED CIRCUIT

(75) Inventor: Raul Andres Bianchi, Grenoble (FR)

(73) Assignee: STMicroelectronics S.A., Montrouge (FR)

( * ) Notice: Subject to any disclaimer, the term of this patent is extended or adjusted under 35 U.S.C. 154(b) by 858 days.

(21) Appl. No.: 10/339,640

(22) Filed: Jan. 9, 2003

(65) Prior Publication Data

US 2003/0173588 A1 Sep. 18, 2003

(30) Foreign Application Priority Data

Jan. 9, 2002 (FR) .................................. 02 00217

(51) Int. Cl.
*G06F 9/455* (2006.01)
(52) U.S. Cl. ..................... 703/14; 716/4; 716/2; 716/8; 703/15
(58) Field of Classification Search ................ 703/2, 703/14, 15; 257/355, 502, 66, 412, 408, 257/372, 48, 410, 392, 607; 438/303, 217, 438/270, 199; 326/113; 716/4, 6, 20, 2
See application file for complete search history.

(56) References Cited

U.S. PATENT DOCUMENTS

| | | | | |
|---|---|---|---|---|
| 5,578,508 A | * | 11/1996 | Baba et al. ................... | 438/270 |
| 5,687,355 A | * | 11/1997 | Joardar et al. ................. | 716/20 |
| 5,841,175 A | * | 11/1998 | Sugiura et al. ............... | 257/392 |
| 6,246,973 B1 | | 6/2001 | Sekine | |
| 6,265,258 B1 | * | 7/2001 | Liang et al. .................. | 438/217 |
| 6,576,966 B1 | * | 6/2003 | Bulucea ...................... | 257/408 |
| 6,593,197 B2 | * | 7/2003 | Wieczorek et al. .......... | 438/303 |
| 6,621,146 B1 | * | 9/2003 | Bowman ..................... | 257/607 |
| 6,744,104 B1 | * | 6/2004 | Aoki et al. ................... | 257/372 |
| 6,798,028 B2 | * | 9/2004 | Horstmann et al. ......... | 257/412 |
| 6,838,698 B1 | * | 1/2005 | Yamazaki et al. ............. | 257/66 |
| 2002/0000834 A1 | * | 1/2002 | Ooishi ........................ | 326/113 |
| 2002/0024045 A1 | * | 2/2002 | Hayashida et al. ............ | 257/48 |
| 2002/0041003 A1 | * | 4/2002 | Udrea et al. ................. | 257/502 |
| 2002/0063290 A1 | * | 5/2002 | Ishii et al. ................... | 257/355 |
| 2002/0066933 A1 | * | 6/2002 | Tsu-Jae ...................... | 257/410 |
| 2002/0086473 A1 | * | 7/2002 | Tsai et al. .................... | 438/199 |

FOREIGN PATENT DOCUMENTS

JP 2002058817 2/2002

OTHER PUBLICATIONS

Hamada et al., "Hot electron trapping activation energy is PMOSFET's under mechanical stress", IEEE 1994.*

(Continued)

*Primary Examiner*—Kandasamy Thangavelu
(74) *Attorney, Agent, or Firm*—Lisa K. Jorgenson; Stephen Bongini; Fleit Gibbons Gutman Bongini & Bianco P.L.

(57) ABSTRACT

A system is provided for modeling an integrated circuit including at least one insulated-gate field-effect transistor. The system includes generator means for defining a parameter representing mechanical stresses applied to the active area of the transistor, and processing means for determining at least one of the electrical parameters of the transistor based at least partially on the stress parameter. Also provided is a method of modeling an integrated circuit including at least one insulated-gate field-effect transistor, and a method of producing an integrated circuit including at least one insulated-gate field-effect transistor.

75 Claims, 10 Drawing Sheets

OTHER PUBLICATIONS

Degraeve et al., "Analysis of externally imposed mechanical stress effects on the hot-carrier induced degradation of MOSFET's", IEEE 1994.*

Momose et al., Relationship between mobility and residual mechanical stress as measured by Raman Spectroscopy for Nitride-oxide gate MOSFETS, IEEE 1990.*

Bradley et al., "Piezoresistive characteristics of short-channel MOSFETs on (100) silicon", IEEE 2001.*

Chung et al., "A new physical and quantitative width dependent hot carrier model for shallow trench isolated CMOS devices", IEEE 2001.*

Hamada et al., "A new aspect on mechanical stress effects in scaled MOS devices", IEEE 1990.*

Ali, H., "Stress-induced parametic shift in plastic packaged devices", IEEE 1997.*

Lochtefeldet al., "Investigating the relationship between electron mobility asnd velocity in deeply scaled NMOS via mechanical stress", IEEE 2001.*

Shimizu et al., "Local mechanical stress control (LMC): A new technique for CMOS-performance enhancement", IEEE 2001.*

Hook et al., "The dependence of channel length on channel width in narrow-channel CMOS devices for 0.35-0.13 um technologies", IEEE 2000.*

Yue et al., "Hot-carrier degradation mechanism in narrow and wide-channel n-MOSFET's with recessed LOCOS isolation structure", IEEE 2000.*

Ito et al., "Mechanical stress effect of Etch-stop nitride and its impact on deep submicron transistor design", IEEE 2000.*

Ishimaru et al., "Chgannekl width dependence of hot-carrier induced degradation in shallow trench isolated PMOSFET's", IEEE 1999.*

Chen et al., "Enhanced hot-carrier induced degradation in shallow trench isolated narrow channel PMOSFET's", IEEE 1998.*

Degraeve et al., "The effect of externally imposed mechanical stress on the hot-carrier induced degradation of deep-sub micron nMOSFET's", IEEE 1997.*

Ferreira et al., "mechanical stress analysis of an LDD MOSFET structure", IEEE 1996.*

Stinebaugh et al., "Correlation of Gm degradation of submicrometer MOSFET's with refractive index and mechanical stress of encaptulation materials", IEEE 1989.*

Foty, D., "Effective MOSFET Modeling for SPICE Circuit Simulation," Northcon/98 Conference Proceedings, Seattle, WA., Oct. 21-23, 1998; IEEE, New York, NY Oct. 21, 1998, pp. 228-235, XP010313455, ISBN: 0-7803-5075-8.

Arora, N.D., "Modeling and Characterization of Ultra Deep Submicron CMOS Devices," IEICE Transactions on Electronics, Institute of Electronics Information and Comm. Eng., Tokyo, Japan, vol. E82,C, No. 6, Jun. 1999, pp. 967-975, XP000919960, ISSN: 0916-8524.

Foty, D., "MOSFET Modeling for Circuit Simulation," IEEE Circuits and Devices Magazine, Jul. 1998, IEEE, USA, vol. 14, No. 4, pp. 26-31, XP002212475, ISSN: 8755-3996.

* cited by examiner

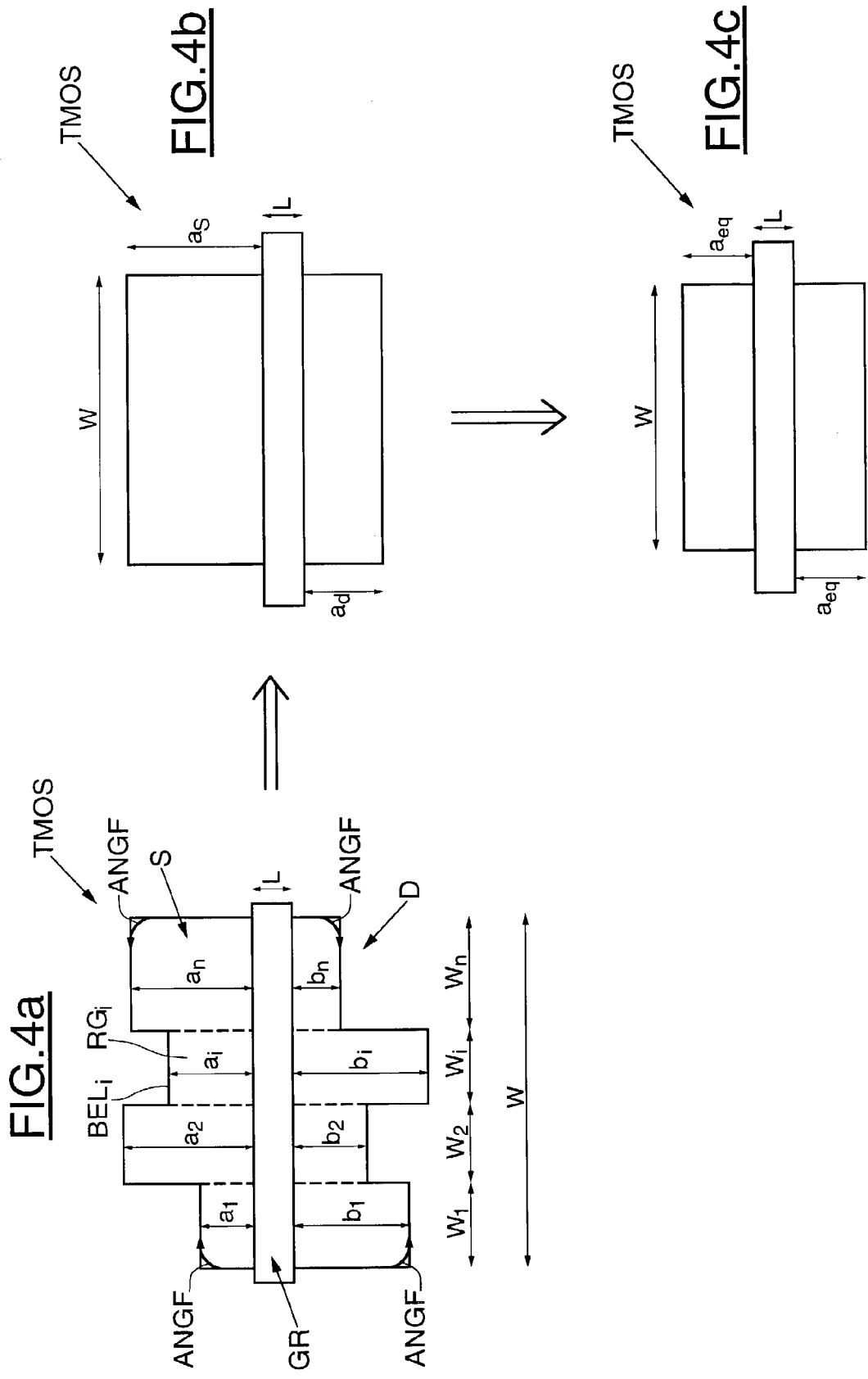

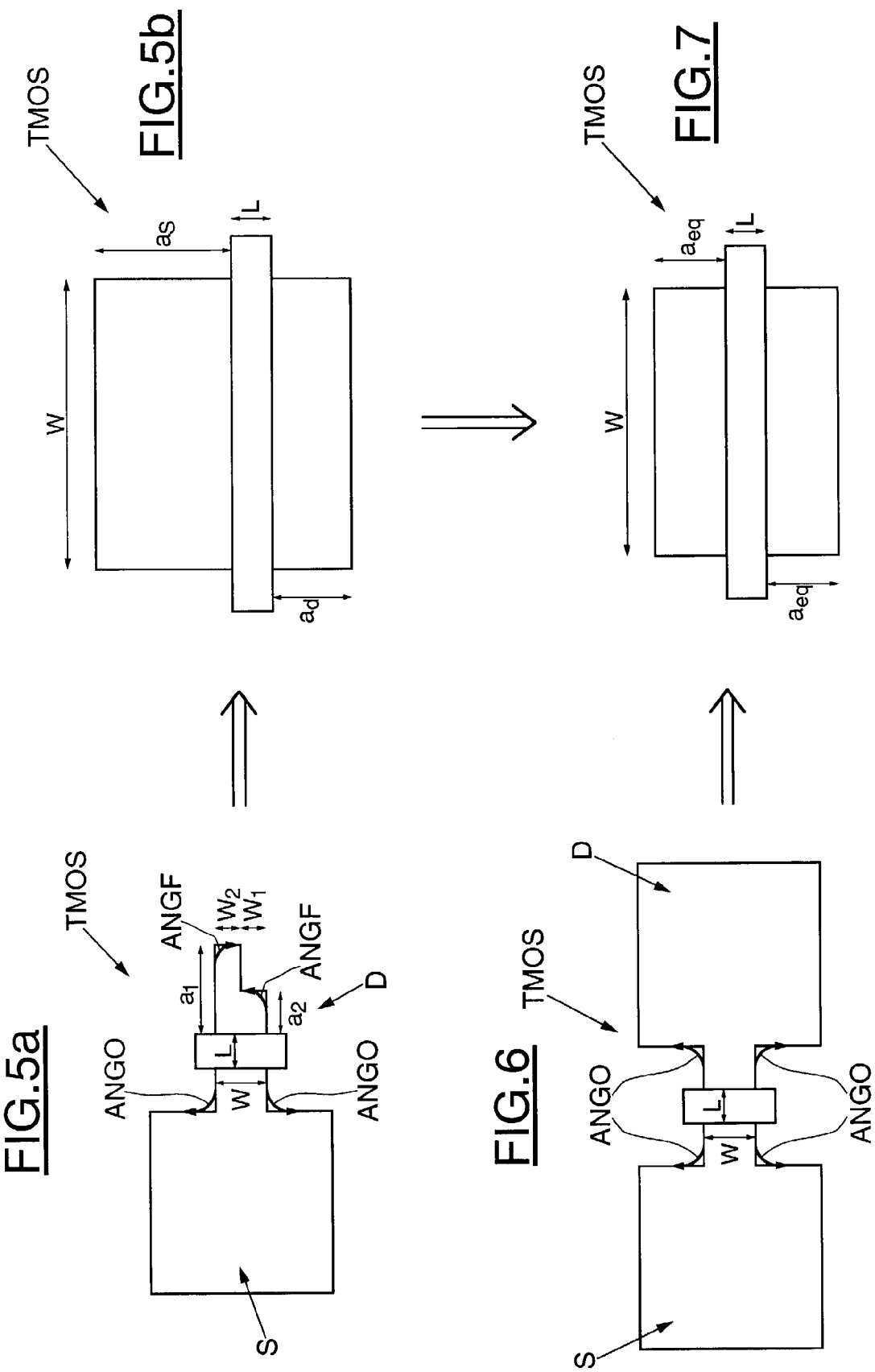

_US 7,480,604 B2_

METHOD OF MODELING AND PRODUCING AN INTEGRATED CIRCUIT INCLUDING AT LEAST ONE TRANSISTOR AND CORRESPONDING INTEGRATED CIRCUIT

CROSS-REFERENCE TO RELATED APPLICATIONS

This application is based upon and claims priority from prior French Patent Application No. 02-00217, filed Jan. 9, 2002, the entire disclosure of which is herein incorporated by reference.

BACKGROUND OF THE INVENTION

1. Field of the Invention

The present invention relates to integrated circuits, and in particular to modeling integrated circuits such as insulated-gate field-effect transistors (MOSFETs).

2. Description of Related Art

Many MOSFET simulation models are currently available, for example the BSIM3v3.2 model available from the Department of Electrical Engineering and Computer Sciences, University of Berkeley, Calif., and described in particular in the 1997-1998 user manual by Weidong Liu and others, which is herein incorporated by reference.

This kind of model is used by integrated circuit designers to define and simulate MOSFET in terms of their required electrical characteristics, for example carrier mobility, threshold voltage, drain current, etc.

In some cases it is found that the performance simulated using these simulation models does not match the real performance expected of the MOSFET finally produced.

The present invention aims to provide a solution to this problem.

SUMMARY OF THE INVENTION

It is an object of the present invention to provide a better approach to the modeling of transistors so that the real performance of the transistor finally produced is closer to the performance simulated using the simulation model.

Another object of the present invention is to produce integrated circuits including MOSFET whose electrical performance, in particular in terms of mobility, can be adjusted and improved as a function of the intended applications.

One embodiment of the present invention provides a system for modeling an integrated circuit including at least one insulated-gate field-effect transistor. The system includes generator means and processing means. The generator means defines a parameter representing mechanical stresses applied to an active area of the transistor, and the processing means determines at least one of the electrical parameters (P) of the transistor at least partially based on the stress parameter. In a preferred embodiment, the generator means defines a useful active area as some or the whole of the active area, and the stress parameter is a geometrical parameter $a_{eq}$ representing a distance in the direction of the length of the channel of the transistor between the gate of the transistor and the edge of the useful active area.

Another embodiment of the present invention provides a method of modeling an integrated circuit including at least one insulated-gate field-effect transistor. According to the method, a parameter ($a_{eq}$) representing mechanical stresses applied to an active area of the transistor is defined, and the parameter ($a_{eq}$) is taken into account when determining at least one electrical parameter (P) of the transistor. In one preferred method, a useful active area (ZAU) is defined as some or the whole of the active area (ZA), and the stress parameter is a geometrical parameter $a_{eq}$ representing a distance in the direction of the length of the channel of the transistor between the gate of the transistor and the edge of the useful active area.

Other objects, features, and advantages of the present invention will become apparent from the following detailed description. It should be understood, however, that the detailed description and specific examples, while indicating preferred embodiments of the present invention, are given by way of illustration only and various modifications may naturally be performed without deviating from the present invention.

BRIEF DESCRIPTION OF THE DRAWINGS

FIGS. 4a to 4c show the derivation of a geometrical parameter representing stresses applied to the active area of a first type of MOS transistor;

FIGS. 5a, 5b, 6 and 7 show the derivation of two other geometrical parameters representing stresses applied to the active areas of two other types of MOS transistor;

DETAILED DESCRIPTION OF PREFERRED EMBODIMENTS

Figure 1:
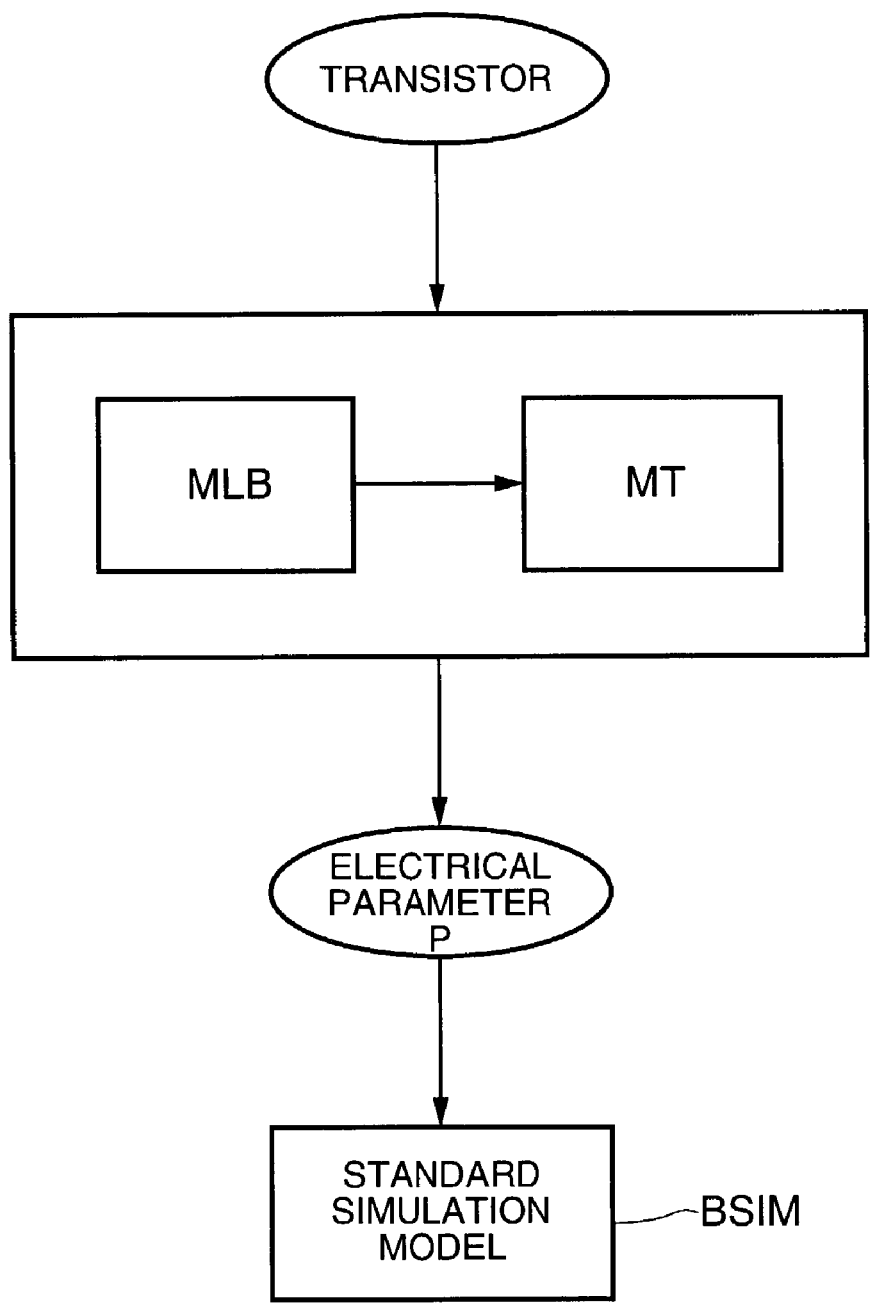
FIG. 1 shows generally a modeling system according to a preferred embodiment of the present invention.

Preferred embodiments of the present invention will be described in detail hereinbelow with reference to the attached drawings.

The present invention stems from the observation that some electrical parameters of a transistor, for example the mobility, threshold voltage or drain/source resistance, vary as a function of mechanical stresses applied to the channel of the transistor. The mechanical stresses are a result of the fabrication process, in particular the forming of electrically insulative regions delimiting the active area of the transistor, for example shallow trench isolation (STI) regions.

Preferred embodiments of the present invention therefore provide a method of modeling an integrated circuit including at least one insulated-gate field-effect transistor. According to the method, a parameter representing mechanical stresses applied to an active area of the transistor is defined and is taken into account when determining at least some electrical parameters of the transistor, for example the carrier mobility, threshold voltage, drain/source access resistance, etc.

In some simple situations, the method could model some electrical parameters directly, taking account of the stress parameter. However, as a general rule, preferred embodiments of the present invention advantageously complement existing standard or non-standard simulation models, for example by correcting some input parameters of existing models that are used in the existing models to determine more sophisticated electrical parameters of the transistors.

For example, the low-field mobility µ0 of the carriers at room temperature is one parameter that the method of the present invention can correct directly to allow for mechanical stresses. Once it has been corrected, this parameter µ0 is injected into an existing model, for example the BSIM3v3.2 model previously cited, where it is used to determine the effective carrier mobility $\mu_{eff}$, which is a more sophisticated parameter taking account in particular of secondary effects in the electrical behavior of the transistor.

In this way, in the final analysis, the electrical parameter $\mu_{eff}$ is determined allowing for the effect of mechanical stresses on the active area of the transistor.

Similarly, the stray drain/source resistance per unit width of the channel Rdsw is a parameter that can easily be determined using the method according to the present invention allowing for the mechanical stresses, and which is subsequently injected into an existing model to determine the drain/source resistance Rds.

The same can also apply to the following parameters, for example:
Vth0: threshold voltage at zero gate/source voltage and for a large channel width,
K1: first order body effect coefficient,
K2: second order body effect coefficient,
K3: narrow channel width coefficient,
K3b: K3 substrate effect coefficient,
Dvt0: first coefficient of short channel effect on threshold voltage,
Dvt0W: first coefficient of short channel effect on threshold voltage for a short channel length,
Eta0: drain-induced barrier lowering (DIBL) coefficient in the subthreshold region, and
Etab: body bias coefficient for the DIBL effect in the subthreshold region.

Once determined by the method according to the present invention allowing for mechanical stresses, such parameters are injected into the BSIM3v3.2 model to determine the threshold voltage Vth.

In one embodiment of the present invention, a "useful" active area is defined as a portion or the whole of the active area of the transistor. This useful active area can be the portion of the active area contained within a rectangle whose lateral dimension in the direction of the width of the channel is equal to the width of the channel, and each edge of which extending in the direction of the width of the channel is at a predetermined limit distance from the corresponding flank of the gate, which distance can be of the order of ten times a minimum distance required for a contact terminal in the active area. This is explained in detail later.

The stress parameter is then preferably a geometrical parameter $a_{eq}$ representing a distance in the direction of the length of the channel of the transistor between the gate of the transistor and the edge of the useful active area.

Thus, the present invention is noteworthy in that an extremely simple and unidimensional geometrical parameter, in this instance a distance, allows for the effect on the electrical parameters of the transistor of three-dimensional mechanical stresses.

If the useful active area of the transistor is rectangular and the gate is centered in the useful active area, to define geometrically identical source and drain regions, the stress parameter $a_{eq}$ can then be the distance in the direction of the length of the channel between one flank of the gate and the corresponding edge of the source or drain region.

However, transistors do not always have rectangular active areas and gates centered in the active areas. Also, if the useful active region of the transistor includes geometrically different source and drain regions, a first geometrical parameter $a_s$ representing a first distance in the direction of the length of the channel between the gate and the edge of the source region is advantageously defined.

A second geometrical parameter $a_d$ representing a distance in the direction of the length of the channel between the gate and the edge of the drain region is also defined.

The stress parameter $a_{eq}$ is then defined by a relationship between the first and second geometrical parameters.

For example, the stress parameter $a_{eq}$ can be made equal to $1/(\frac{1}{2}a_s + \frac{1}{2}a_d)$.

If the useful active area of the transistor includes at least one source or drain region each lateral side of which is free of obtuse angles, and if it is possible to divide the source and drain region into n individual rectangular regions, n being greater than or equal to 1, each individual region is defined by an individual width $W_i$ and by an individual distance $a_i$ in the direction of the length of the channel between the gate and an individual edge of the individual region.

The corresponding geometrical parameter $a_s$ or $a_d$ can then be equal to $$W / \left( \sum_{i=1}^{n} W_i / a_i \right),$$

where W is the width of the channel of the transistor.

On the other hand, if the useful active area of the transistor includes at least one source or drain region at least one lateral side of which has at least one obtuse angle, then the corresponding parameter $a_s$ or $a_d$ can be considered to be equal to infinity.

Similarly, for reasons of simplification, if an individual distance $a_i$ of an individual region of the useful active area is equal to the limit distance delimiting the rectangle of the useful active area, then the individual distance $a_i$ is considered to be equal to infinity, for example.

In one embodiment of the present invention, an electrical parameter P of the transistor is determined from an equation involving: the value of the electrical parameter determined for a required minimum distance of the active area, the value of the stress parameter of the transistor, the value of the required minimum distance, and a coefficient associated with the electrical parameter and depending on the width and the length of the channel of the transistor.

If the stress parameter is a geometrical parameter $a_{eq}$, the electrical parameter P concerned is then defined by the following equation, for example:

$$P = Pa_{min}(1 + CP_{L,W}(1 - a_{min}/a_{eq}))$$

in which $Pa_{min}$ is the value of the electrical parameter P determined for the required minimum distance $a_{min}$ of the active area and $CP_{L,W}$ is the coefficient associated with the parameter P.

In this case, determining the coefficient $CP_{L,W}$ includes the following steps, for example:

reference transistors are produced having different reference values Wref, Lref for the width and the length of the channel and different values for the stress parameter, the value of the electrical parameter P concerned for each reference transducer produced is measured, a reference coefficient $CP_{Lref,Wref}$ is determined for each pair of values Wref, Lref, being the slope of a straight line whose equation is $Y=1+CP_{Lref,Wref}X$, in which $Y=P/Pa_{min}$ and $X=1-a_{min}/a_{eq}$, and the coefficient $CP_{L,W}$ is determined from the reference coefficients $CP_{Lref,Wref}$ allowing for the width W and the length L of the channel of the transistor, possibly using interpolation.

The present invention further provides a system for modeling an integrated circuit including at least one insulated-gate field-effect transistor.

According to one general feature of the present invention, the system preferably includes generator means adapted to define a parameter representing mechanical stresses applied to the active area of the transistor and processing means adapted to determine at least some of the electrical parameters of the transistor taking account of the stress parameter.

In one embodiment of the present invention, the generator means is adapted to define a useful active area as some or the whole of the active area and the stress parameter is a geometrical parameter $a_{eq}$ representing a distance in the direction of the length of the channel of the transistor between the gate of the transistor and the edge of the useful active area.

In one embodiment of the present invention, the useful active area of the transistor is rectangular and the gate is centered in the useful active area to define geometrically identical source and drain regions. The generator means defines the stress parameter $a_{eq}$ as the distance in the direction of the length of the channel between a flank of the gate and the corresponding edge of the source or drain region.

In another embodiment of the present invention, the useful active area of the transistor includes geometrically different source and drain regions. The generator means defines a first geometrical parameter $a_s$ representing a first distance in the direction of the length of the channel between the gate and the edge of the source region and a second geometrical parameter $a_d$ representing a distance in the direction of the length of the channel between the gate and the edge of the drain region. The generator means defines the stress parameter $a_{eq}$ by an equation linking the first geometrical parameter and the second geometrical parameter.

In one embodiment of the present invention, the processing means defines an electrical parameter of the transistor by an equation involving: the value of the electrical parameter determined for a reference distance, for example a required minimum distance of the active area, the value of the stress parameter of the transistor, the value of the reference distance, for example the required minimum distance, and a coefficient associated with the electrical parameter and depending on the width and the length of the channel of the transistor.

The electrical parameter P concerned can then be defined by the equation $P=Pa_{min}(1+CP_{L,W}(1-a_{min}/a_{eq}))$, in which $Pa_{min}$ is the value of the electrical parameter P determined for the required minimum distance $a_{min}$ of the active area and $CP_{L,W}$ is the coefficient associated with the parameter P.

The modeling device then includes a plurality of reference transistors having different reference values Wref, Lref for the channel width and length and different values for the stress parameter.

Further, the processing means advantageously includes:

measuring means for measuring the value of the electrical parameter P for each reference transistor produced, first calculator means for calculating for each pair of values Wref, Lref a reference coefficient $CP_{Lref,Wref}$ defined as the slope of the straight line of the equation $Y=1+CP_{Lref,Wref}X$, in which $Y=P/Pa_{min}$ and $X=1-a_{min}/a_{eq}$, and second calculator means for calculating the coefficient $CP_{L,W}$ from the reference coefficients $CP_{Lref,Wref}$ taking account of the width W and the length L of the channel of the transistor, possibly using interpolation.

For the production of transistors, the present invention preferably also adjusts the geometry of the active area of the transistor as a function of a required value of an electrical parameter, for example the carrier mobility, threshold voltage, etc.

In other words, it is possible to determine the electrical parameter concerned for a given geometrical parameter of the active area using a modeling method according to an embodiment of the present invention. Consequently, and conversely, to produce an integrated transistor, it is possible to determine the geometrical parameter of the active area of the transistor that will produce the required value for the electrical parameter concerned.

In other words, the present invention also provides a method of producing an integrated circuit including at least one insulated-gate field-effect transistor, in which the geometry of an active area of the transistor is defined using a parameter representing mechanical stresses applied to the active area, allowing for a required value of at least one electrical parameter of the transistor determined by a modeling method as defined hereinabove and allowing for the stress parameter.

Accordingly, the geometry of an active area of a transistor can be adjusted to optimize the transistor in terms of mobility, for example, which will have the further consequence of reducing the drain/source resistance, which is doubly beneficial in the case of a MOSFET.

In one embodiment, a useful active area is defined as some or the whole of the active area and the stress parameter is a geometrical parameter $a_{eq}$ representing a distance in the direction of the length of the channel of the transistor between the gate of the transistor and the edge of the useful active area.

Accordingly, if the transistor is an NMOS transistor and the geometrical parameter $a_{eq}$ is more than twice a minimum distance $a_{min}$ required for a contact terminal in the active area, an improvement in carrier mobility in particular is obtained, compared to a transistor in which the length of the active area is equal to the required minimum distance.

Similarly, if the integrated circuit includes at least one block including a plurality of NMOS transistors for more than 80% of which the geometrical parameter $a_{eq}$ is more than twice the minimum distance, the whole of the block of the integrated circuit is considered to have an advantage in terms of the mobility criterion in particular.

These advantages, in terms of mobility in particular, are also obtained if the transistor is a PMOS transistor. In this case, the geometrical parameter $a_{eq}$ is then preferably less than twice the required minimum distance.

Similarly, this advantage with regard to the mobility criterion in particular also applies to an integrated circuit including at least one block including a plurality of PMOS transistors of which more than 80% have their geometrical parameter $a_{eq}$ less than twice the required minimum distance, for example.

The present invention also provides an integrated circuit including at least one insulated-gate field-effect transistor.

According to one general feature of the present invention, the active area of the transistor includes a useful active area defined as a portion or the whole of the active area of the transistor and the distance $a_{eq}$ in the direction of the length of the channel of the transistor between the gate of the transistor and the edge of the useful active area is different from a required minimum distance $a_{min}$ for a contact terminal on the active area.

In one embodiment, the transistor is an NMOS transistor and the distance $a_{eq}$ is greater than twice the minimum distance $a_{min}$.

In another embodiment, the integrated circuit includes at least one block including a plurality of NMOS transistors and more than 80% of the NMOS transistors have their geometrical parameter $a_{eq}$ greater than twice the minimum distance $a_{min}$.

In another embodiment of the present invention, the transistor is a PMOS transistor and the distance $a_{eq}$ is less than twice the minimum distance $a_{min}$.

In one embodiment of the present invention, the integrated circuit includes at least one block including a plurality of PMOS transistors and more than 80% of the PMOS transistors have their distance $a_{eq}$ less than twice the minimum distance $a_{min}$.

In any of the above embodiments, the useful active area can be the portion of the active area within a rectangle whose lateral dimension in the direction of the width of the channel is equal to the width of the channel and each edge of which in the direction of the width of the channel is at a predetermined limit distance from the corresponding flank of the gate, for example of the order of ten times the required minimum distance $a_{min}$.

Exemplary embodiments of the present invention will now be described in detail with reference to the figures.

FIG. 1 shows generally a modeling system according to a preferred embodiment of the present invention. In FIG. 1, generator means MLB produces a stress parameter representing mechanical stresses applied to the active area of a transistor from the layout diagram of the transistor. In material terms, the generator means can consist of an extractor (known to the person skilled in the art) which extracts from transistor layout diagrams dimensional parameters of the transistor, for example the length and the width of the channel, as well as information on connections.

Once this stress parameter has been determined, as described in more detail later, processing means MT, preferably implemented as software in a microprocessor for example, determines at least some of the electrical parameters of the transistor P allowing for the stress parameter.

For example, the electrical parameter P can be the low-field carrier mobility μ0 at room temperature, the threshold voltage Vth0 at zero gate/source voltage and for a long channel, or the stray source/drain resistance Rdsw per unit width of the channel.

These electrical parameters P that take account of the stresses applied to the active area of the transistor can then be injected into a standard BSIM simulation model, such as the BSIM3v3.2 model from the University of Berkeley previously cited. The model can then be used to calculate other, more sophisticated parameters, such as the effective mobility $\mu_{eff}$, the drain/source resistance Rds, and the threshold voltage Vth. However, the parameters obtained from the BSIM model also allow for stresses applied to the active area of the transistor.

It has been observed that it is possible to take account of all three-dimensional stresses applied to the active area using a stress parameter that is in fact a one-dimensional parameter, to be more precise a geometrical parameter $a_{eq}$ representing a distance in the direction of the length of the channel of the transistor between the gate of the transistor and the edge of the active area.

Figure 2:
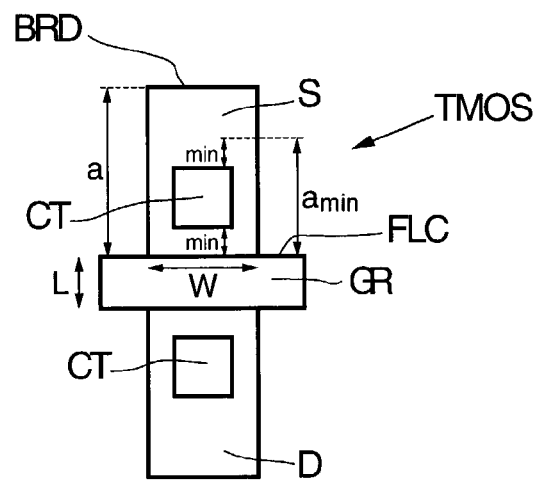
FIG. 2 is a diagram of a MOS transistor.

When, as shown in FIG. 2, the active area of a PMOS transistor is rectangular and the gate GR is centered in the active area to define geometrically identical source and drain regions S and D, the stress parameter $a_{eq}$ is defined as the distance $a$ in the direction of the length L of the channel between a flank FLC of the gate and the corresponding edge BRD of the source or drain region, here the source region. Note that this distance $a$ can be different from a minimum distance $a_{min}$ required for producing a contact terminal CT in the source or drain region.

Figure 3:
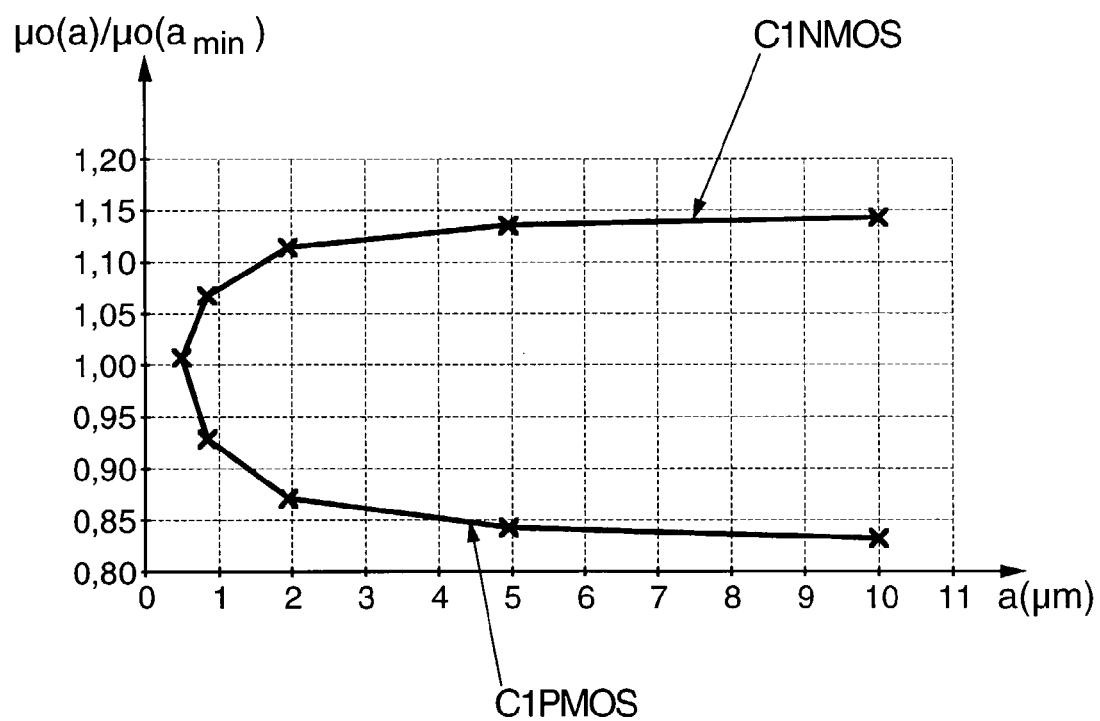
FIG. 3 shows two curves illustrating the advantages of a preferred embodiment of the present invention in terms of transistor carrier mobility.

FIG. 3 shows the variation of a function of the distance $a$ of the ratio between the mobility μ0 for the value $a$ and the mobility μ0 for the value $a_{min}$. Note that the mobility μ0 increases with $a$ for an NMOS transistor (curve C1NMOS) and decreases with $a$ for a PMOS transistor (curve C1PMOS). On the other hand, for a PMOS transistor, the mobility would increase if $a$ were less than $a_{min}$.

If the active area of the transistor includes geometrically different source and drain regions, a first geometrical parameter $a_s$ is preferably defined representing a first distance in the direction of the length of the channel between the gate and the edge of the source region. A second geometrical parameter $a_d$ is preferably defined representing a distance in the direction of the length of the channel between the gate and the edge of the drain region. The stress parameter $a_{eq}$ is then defined by the following equation:

$$a_{eq} = 1/(\tfrac{1}{2}a_s + \tfrac{1}{2}a_d) \qquad (I)$$

Not only can the source and drain regions be geometrically different, but they can also be irregular, as is the case in FIG. 4a or in FIGS. 5a and 6.

Geometrically irregular source and drain areas having acute angles ANGF, as shown in FIG. 4a and on the right-hand side of FIG. 5a, are distinguished from those having obtuse angles ANGO, as shown on the left-hand side of FIG. 5a and in FIG. 6.

Refer now to FIG. 4a in particular, which shows a source region S and a drain region D, each lateral side of which is free of obtuse angles and defines with the perpendicular edge of the area concerned an acute angle ANGF, here an angle equal to 90°.

The source region S is divided into n individual regions $RG_i$ (here n=4). Each individual region $RG_i$ has an individual width $W_i$ and an individual edge $BEL_i$ at an individual distance $a_i$ in the direction of the length L of the channel from the gate GR.

The geometrical parameter $a_s$ is then defined by the following equation:

$$a_s = W \Big/ \left( \sum_{i=1}^{n} W_i / a_i \right) \qquad (II)$$

in which W is the total width of the channel.

Similarly, the drain region D is divided into four individual regions having the individual width $W_i$ and whose extreme edge is at an individual distance $b_i$ from the corresponding flank of the gate GR.

The geometrical parameter $a_d$ is then defined by the following equation:

$$a_d = W \bigg/ \left( \sum_{i=1}^{n} W_i / b_i \right) \quad \text{(III)}$$

From the modeling point of view, the FIG. 4a TMOS transistor is then equivalent to the FIG. 4b TMOS transistor.

Further, the stress parameter $a_{eq}$ is then defined by equation (I) above. From the modeling point of view, the FIG. 4a TMOS transistor is then equivalent to the FIG. 4c TMOS transistor having a regular and rectangular active area with a centered gate GR.

It must be pointed out that, this time, the parameter $a_{eq}$ can be very much greater than the parameter $a_{min}$ or much less than the parameter $a_{min}$.

Irregular source or drain surfaces having obtuse angles ANGO are described next with reference to FIGS. 5a to 7.

As shown in FIG. 5a and FIG. 6, the presence of an obtuse angle ANGO (here an angle of 270°) at the level of a lateral edge of the area concerned implies a lateral extension of the region concerned toward the exterior of the channel.

For this kind of source or drain region, the corresponding geometrical parameter $a_s$ or $a_d$ is preferably then taken as equal to infinity.

The TMOS transistor that is geometrically equivalent from the modeling point of view to the FIG. 5a TMOS transistor is that shown in FIG. 5b with the parameter $a_s$ equal to infinity and the parameter $a_d$ defined by the above equation III.

The TMOS transistor finally equivalent from the modeling point of view to the FIG. 5a transistor is the FIG. 7 TMOS transistor in which $a_{eq}$ is still defined by the above equation I but in this instance is equal to $2a_d$, since $a_s$ is equal to infinity.

In FIG. 6, the source and drain regions both have obtuse angles ANGO. Consequently, the two parameters $a_s$ and $a_d$ are equal to infinity and the parameter $a_{eq}$ of the equivalent TMOS transistor (FIG. 7) is, in theory, still defined by the above equation I and is in practice equal to infinity, since $a_s$ and $a_d$ are themselves equal to infinity.

Figure 8:
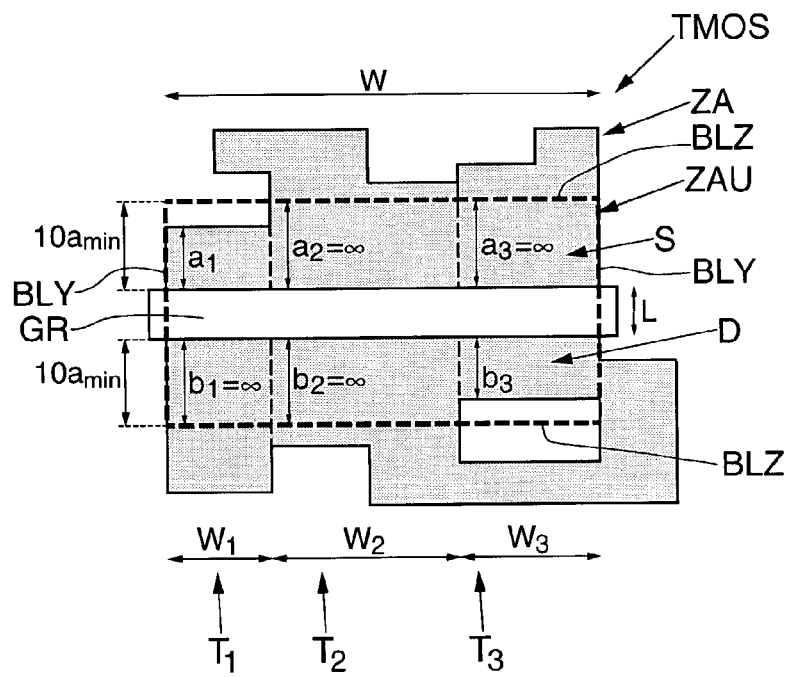
FIG. 8 shows the definition of a useful active area within an active area of an MOS transistor.

If the active area ZA of a TMOS transistor is particularly complex, as is the case in FIG. 8 for example, it is then preferable to define a "useful" active area ZAU inside the active area of the transistor, which is contained within a rectangle each of whose edges BLZ in the direction of the width W of the channel is at a predetermined limit distance from the corresponding flank of the gate, which distance is here equal to $10a_{min}$.

Additionally, the lateral dimension of this rectangle, still in the direction of the width of the channel, i.e. in fact in the direction of the length of the edges BLZ (the distance between the lateral edges BLY), is equal to the width W of the channel.

Here, the value $10a_{min}$ is a good compromise between the improvement in mobility that can be hoped for, for example, and the simplicity of the modeling. Beyond this value $10a_{min}$, the improvement in mobility is very slight, as shown in the curve C1NMOS in FIG. 3.

Having defined the useful active area ZAU, the procedure is then as previously described, possibly dividing the source and drain regions into n individual regions, here three individual regions defining three individual transistors $T_1$, $T_2$, $T_3$.

Furthermore, an individual distance $a_i$ or $b_i$ is then preferably considered equal to infinity if it is equal to the limit distance $10a_{min}$.

The parameters $a_s$ and $a_d$ of the TMOS transistor limited to the useful active area are then determined as previously described.

Thus, the parameter $a_s$ defined by the above equation II is in fact substantially defined by the following equation:

$$a_s = W/(W_1/a_1) \quad \text{(IV)}$$

since the distances $a_2$ and $a_3$ are equal to infinity.

Similarly, the parameter $a_d$ is then simply defined by the following equation:

$$a_d = W/(W_3/b_3) \quad \text{(V)}$$

since the distances $b_1$ and $b_2$ are equal to infinity.

The equivalent parameter $a_{eq}$ is still defined by the above equation I.

Once the geometrical parameter $a_{eq}$ has been obtained, the processing means determines the electrical parameter of the transistor P.

In this embodiment, the electrical parameter P is defined by the following equation:

$$P = Pa_{min}(1 + CP_{L,W}(1 - a_{min}/a_{eq})) \quad \text{(VI)}$$

in which $Pa_{min}$ is the value of the electrical parameter P determined for the required minimum distance $a_{min}$ of the active area and $CP_{L,W}$ is a coefficient associated with the electrical parameter P and depending on the width W and the length L of the channel of the transistor.

Figure 9:
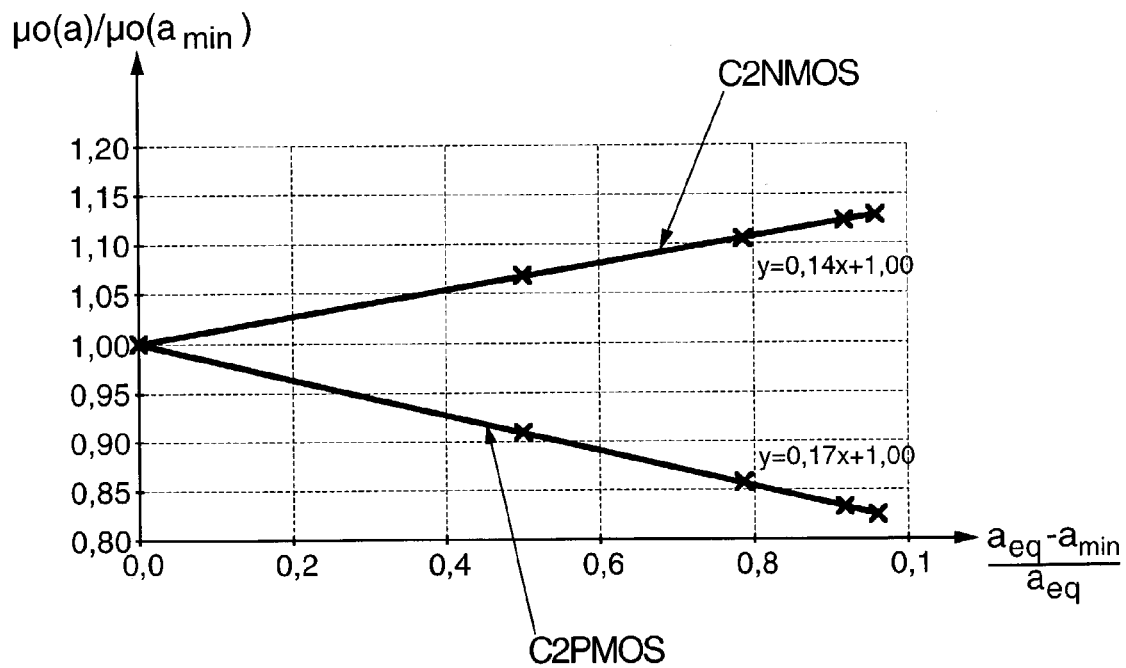
FIG. 9 shows two other curves illustrating a relationship between carrier mobility and the geometrical parameter representing stresses.

This equation is shown in the particular case of the mobility $\mu 0$ in FIG. 9. The curve C2NMOS, which is in fact a straight line, illustrates this equation for an NMOS transistor, and the straight line C2PMOS illustrates this equation for a PMOS transistor. The coefficient $CP_{L,W}$ thus appears to be the slope of a straight line of this kind.

Figure 10:
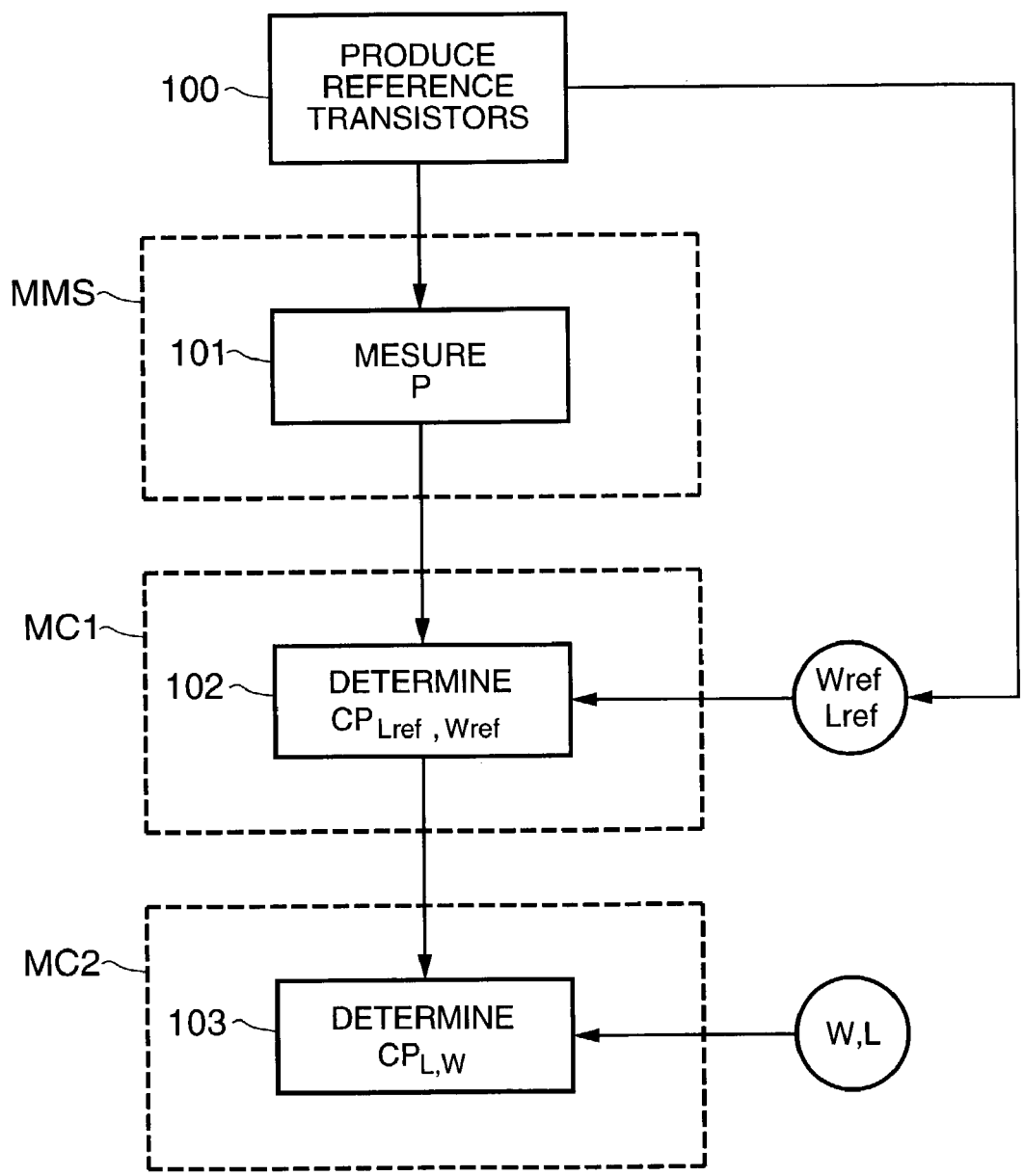
FIG. 10 shows in more detail how the modeling system determines the slope of the curves shown in FIG. 9.

The procedure shown in FIG. 10 is advantageously used to determine the coefficient $CP_{L,W}$ associated with the parameter P.

Several test or reference transistors are produced (step 100) with different reference values $W_{ref}$ and $L_{ref}$ for the width and the length of the channel and different values for the stress parameter $a_{eq}$.

Conventional measuring systems MMS are then used to measure the value of the electrical parameter P of concern for each reference transistor produced (step 101). For example, a mobility or a threshold voltage can be measured on a reference transistor using the known Hammer method.

First calculation means MC1 then determines (step 102), for each pair of values $W_{ref}$ and $L_{ref}$, a reference coefficient $CP_{Lref,Wref}$ which is the slope of the straight line for the equation:

$$Y = 1 + CP_{Lref,Wref} X$$

in which:
Y = $P/Pa_{min}$, and
X = $1 - a_{min}/a_{eq}$.

Second calculation means MC2 determines (step 103) the coefficient $CP_{L,W}$ from the reference coefficients $CP_{Lref,Wref}$ allowing for the width W and the length L of the channel of the transistor, possibly using interpolation.

Figure 11:
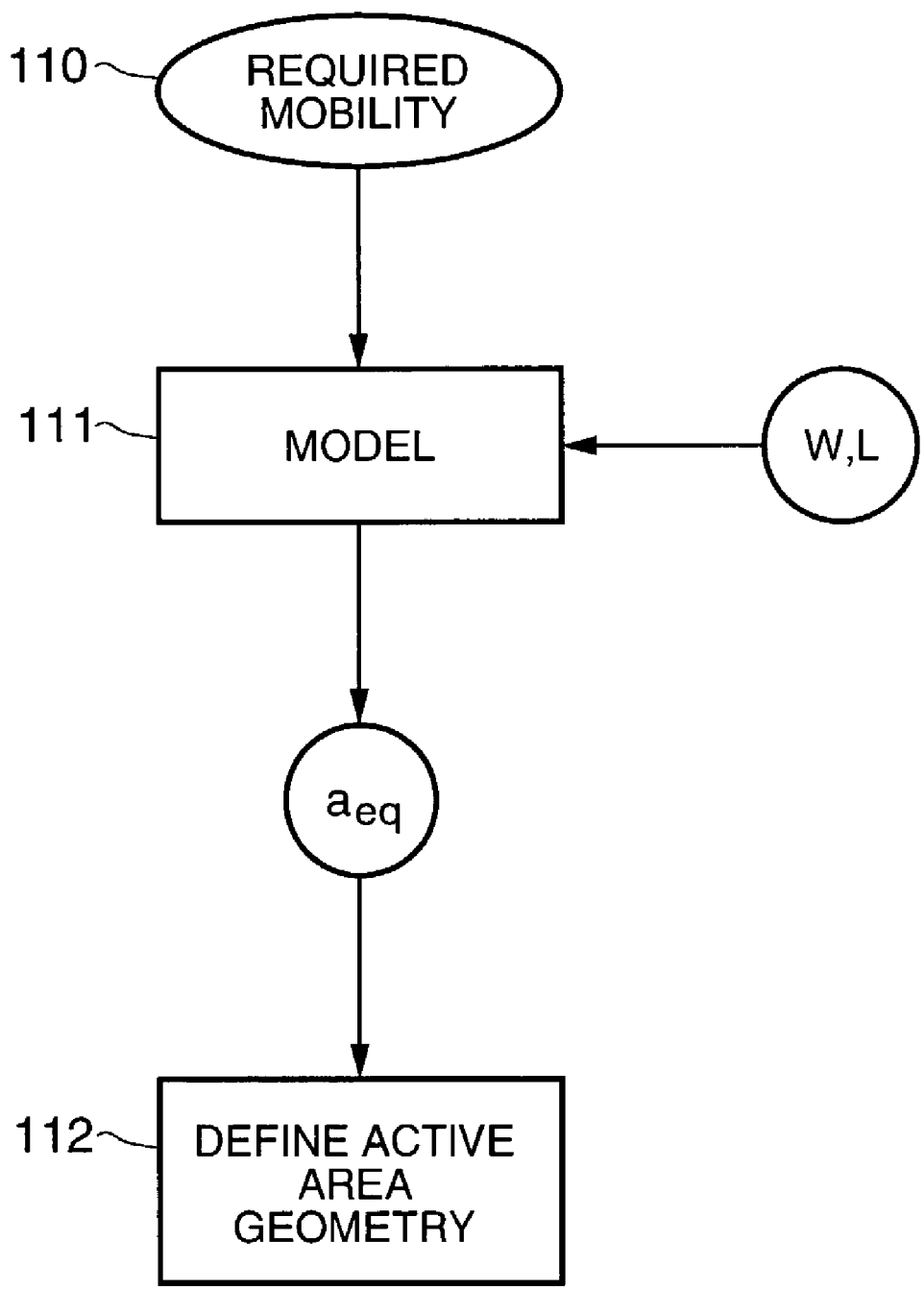
FIG. 11 shows a general flowchart of one exemplary application of a method in accordance with a preferred embodiment of the present invention.

The present invention can also be used to produce integrated circuits including MOS transistors in which the geometry of the active area of the transistors can be adjusted as a function of a required value of an electrical parameter of the transistor, for example the mobility (FIG. 11).

In this case, as shown in FIG. 11, for a required mobility (step 110) and for a chosen channel width and length for the transistor, application (step 111) of the simulation model according to the present invention described above delivers the value of the stress parameter $a_{eq}$. The geometry of the active area of the transistor can then be defined (step 112).

Figure 12:
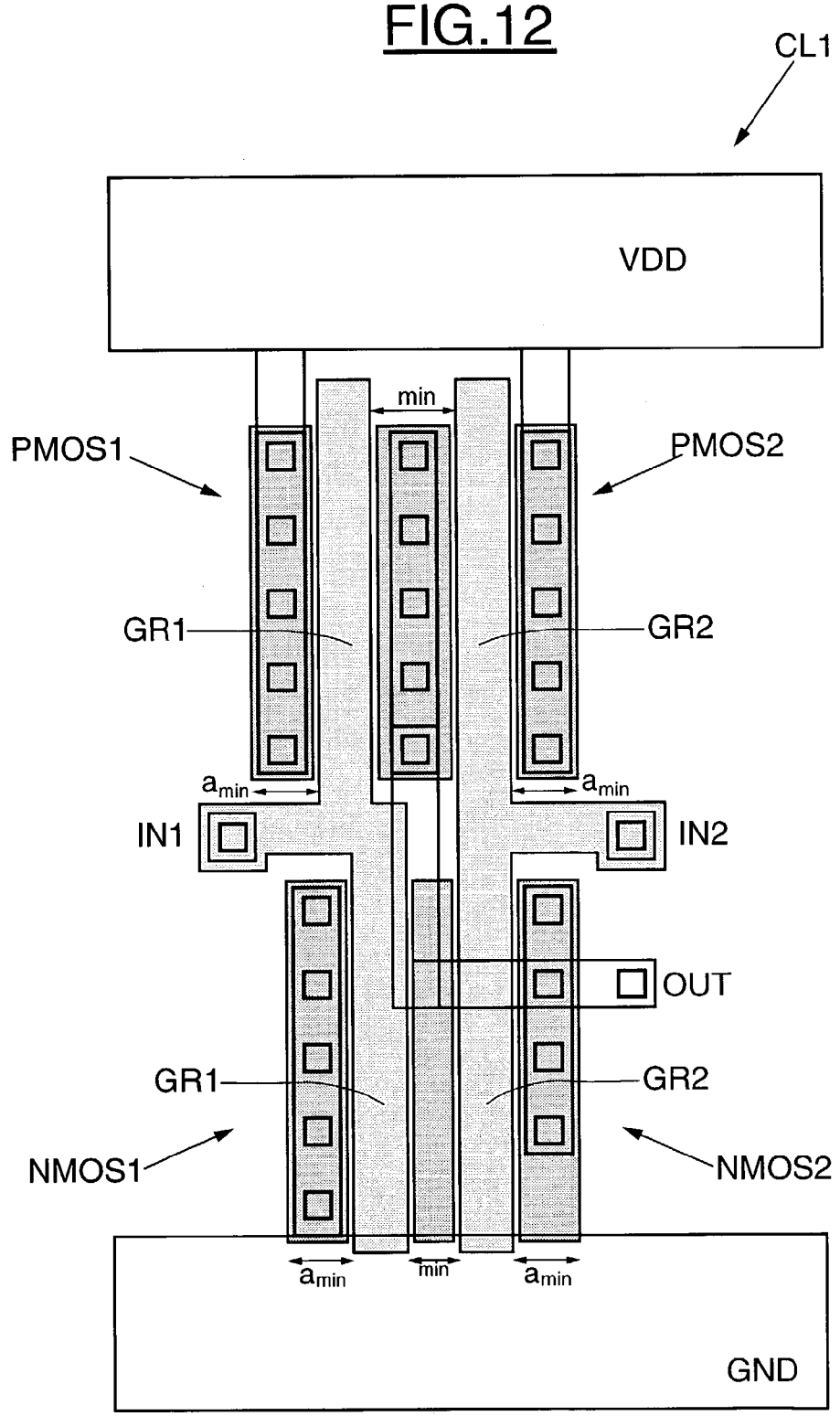
FIGS. 12 to 14 show three different geometrical configurations of a base cell of an integrated circuit, providing different mobilities.

Thus, FIG. 12 shows a diagram of the layout diagram of a basic NAND gate cell CL1 with two inputs (NAND2 gate). The cell conventionally includes two PMOS transistors PMOS1 and PMOS2 and two NMOS transistors NMOS1 and NMOS2. The first input IN1 of the cell CL1 is taken to the gates GR1 of the two transistors PMOS1 and NMOS1 and the second input IN2 of the cell is taken to the gates GR2 of the two transistors PMOS2 and NMOS2. The output OUT of the cell CL1 is taken from the common source region of the transistors PMOS1 and PMOS2.

FIG. 12 shows that the respective lengths in the direction of the length of the channel of the source and drain areas of the transistors are made equal to the minimum distance $a_{min}$. Likewise, the spacing between the gates is made equal to a minimum value min. Consequently, this kind of cell is produced applying a high density criterion.

With regard to the PMOS transistors, on the other hand, the stress parameter $a_{eq}$ is greater than the parameter $a_{min}$ and less than twice that parameter. The same applies to the NMOS transistors. Consequently, this kind of cell CL1 is not optimized in terms of mobility, in particular compared to a cell CL2 of the same type, as shown in FIG. 13.

Figure 13:
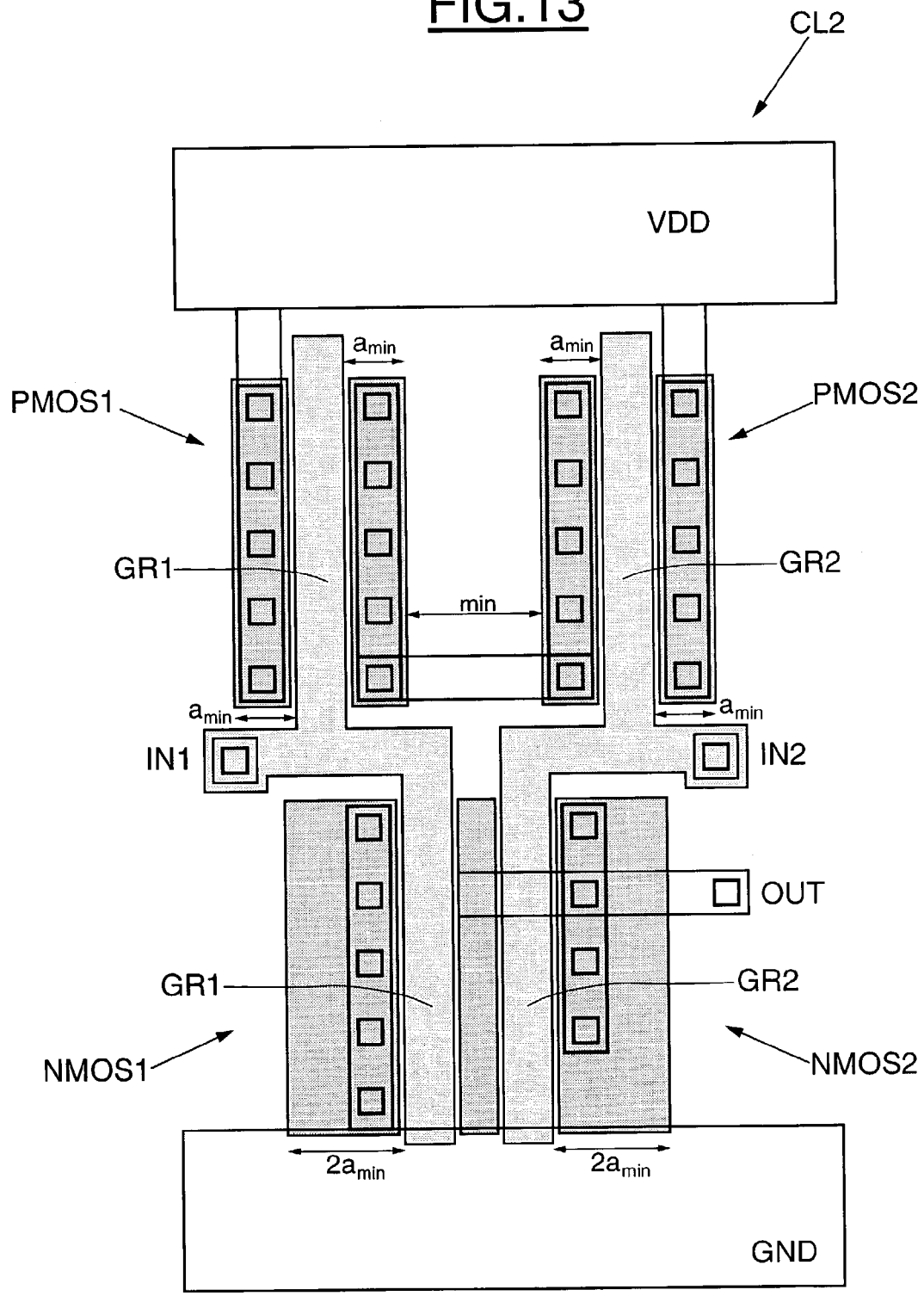

FIG. 13 shows that the source regions of the transistors PMOS1 and PMOS2 are separated by the distance min. Also, the length of these source and drain regions has been made equal to $a_{min}$. Consequently, the stress parameter $a_{eq}$ for these two PMOS transistors is equal to $a_{min}$.

Similarly, the width of the source regions of the NMOS transistors has been increased to $2a_{min}$. Consequently, the stress parameter $a_{eq}$ for the two NMOS transistors is more than twice the required minimum distance $a_{min}$.

The cell CL2, therefore, has a higher mobility than the cell CL1.

Figure 14:
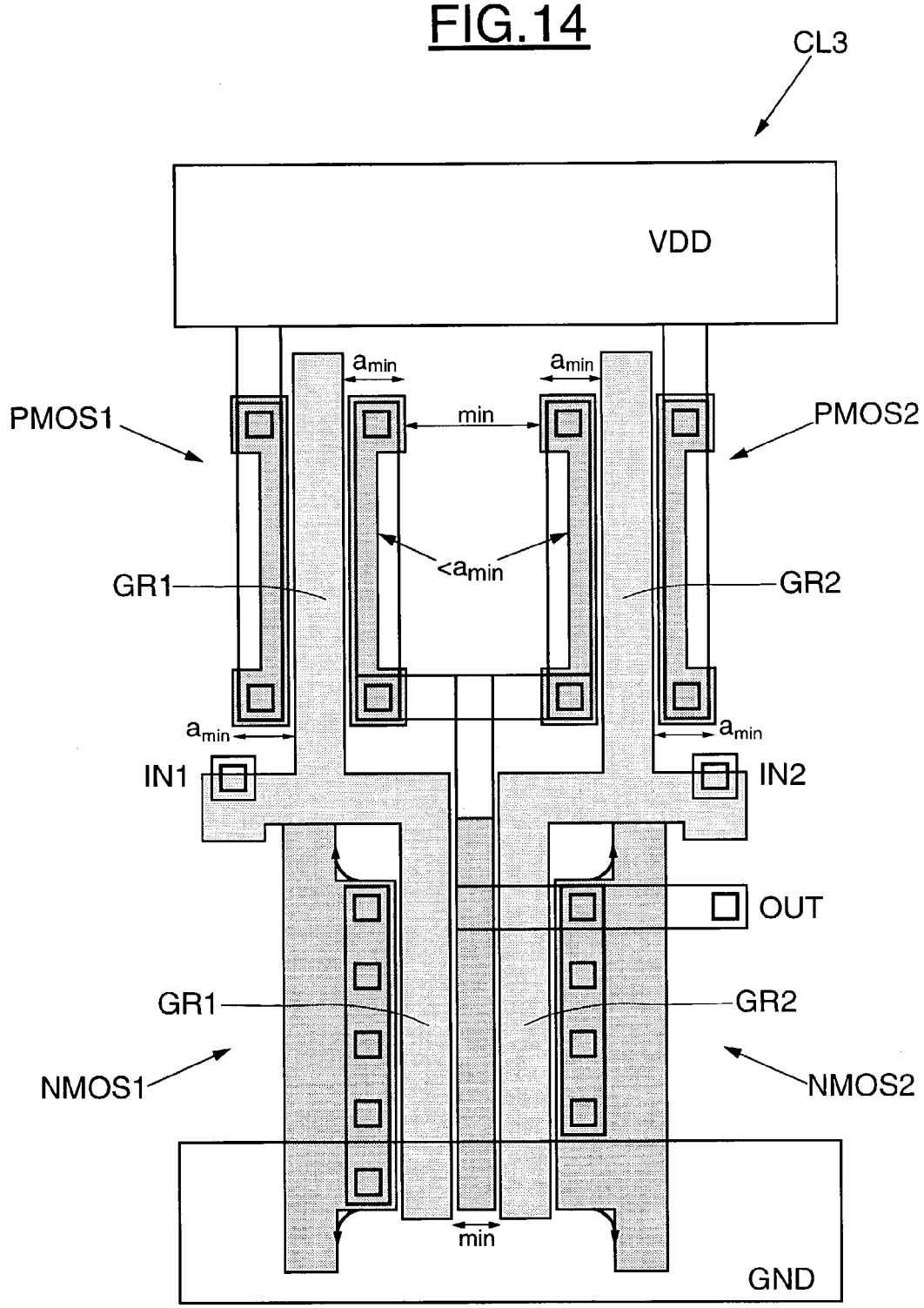

The cell CL3 (FIG. 14), which is also a NAND2 cell, has an even higher mobility. This is because the active areas of the transistors PMOS1 and PMOS2 have a constriction between the contact terminals and the width of this restriction is less than the distance $a_{min}$. Consequently, the stress parameter $a_{eq}$ for the two PMOS transistors is less than the required minimum distance $a_{min}$.

Also, the active areas of the NMOS transistors have obtuse angles, which makes the parameter $a_{eq}$ equal to infinity.

The present invention is not limited to the embodiments and applications described above, and encompasses all variants thereof. For example, the determination of the parameter P has been described above using a reference value $Pa_{min}$ which is the value of the parameter for the reference value $a_{min}$. Without changing the general principles and advantages of the present invention, a different reference value could be used, for example the value of the parameter for a reference distance other than $a_{min}$.

Also, the definition of the electrical parameter P is not limited to the above equation VI. Other equations involving the value of the parameter P for the reference distance and the coefficient depending on the width and the length of the channel could be envisaged for some parameters, such as the threshold voltage.

Thus, to calculate the threshold voltage, an equation of the type $P=Pa_{min}+CP2_{L,W}(1-a_{min}/a_{eq})$ could be used, for example, in which $CP2_{L,W}$ is obtained from the product of two constants $Pa_{min}$ and $CP_{L,W}$.

In this case, the correction of the threshold voltage Vth in the BSIM3v3.2 model, for example, entails correcting only the parameter Vth0 (threshold voltage at zero gate/source voltage and for a large channel width), whereas using a multiplier correction defined by equation VI would necessitate previous correction of the parameters Vth0, K2, K2, K3, K3b, Dvt0, Dvt0w, Eta0, Etab.

While there has been illustrated and described what are presently considered to be the preferred embodiments of the present invention, it will be understood by those skilled in the art that various other modifications may be made, and equivalents may be substituted, without departing from the true scope of the present invention. Additionally, many modifications may be made to adapt a particular situation to the teachings of the present invention without departing from the central inventive concept described herein. Furthermore, an embodiment of the present invention may not include all of the features described above. Therefore, it is intended that the present invention not be limited to the particular embodiments disclosed, but that the invention include all embodiments falling within the scope of the appended claims.

What is claimed is:

1. A computer implemented method of modeling an integrated circuit including at least one insulated-gate field-effect transistor, said method including:
   defining a stress parameter representing mechanical stresses applied to an active area of the transistor;
   determining at least one electrical parameter of the transistor taking into account the stress parameter; and
   outputting the at least one electrical parameter of the transistor to a tangible computer readable medium or display,
   wherein the stress parameter comprises an equivalent geometrical parameter; and
   wherein the determining the at least one electrical parameter of the transistor is performed using an equation involving at least:
   the at least one electrical parameter determined for a reference distance,
   the reference distance,
   the stress parameter of the transistor, and
   a coefficient associated with the at least one electrical parameter and depending on a width and a length of a channel of the transistor.

2. The method according to claim 1, further comprising:
   defining a useful active area of the transistor as some or the whole of the active area,
   wherein the stress parameter represents at least one distance in a direction of the length of the channel of the transistor between a gate of the transistor and an edge of the useful active area.

3. The method according to claim 1, further comprising:
   defining a useful active area of the transistor as some or the whole of the active area,
   wherein the useful active area of the transistor is rectangular and the gate is centered in the useful active area to define geometrically identical source and drain regions, and
   the stress parameter is defined as the distance in the direction of the length of the channel between a flank of the gate and a corresponding edge of the source or the drain region.

4. The method according to claim 1, further comprising:
   defining a useful active area of the transistor as some or the whole of the active area,
   wherein the useful active area of the transistor includes geometrically different source and drain regions,
   the method further includes defining a first geometrical parameter $a_s$ representing a first distance in the direction of the length of the channel between the gate and the edge of the source region and a second geometrical parameter $a_d$ representing a second distance in the direction of the length of the channel between the gate and the edge of the drain region, and the stress parameter is defined using an equation linking the first geometrical parameter and the second geometrical parameter.

5. The method according to claim 4, wherein the stress parameter is defined as being equal to:

$1/(\tfrac{1}{2}a_s+\tfrac{1}{2}a_d)$.

6. The method according to claim 4, wherein the useful active area of the transistor includes at least one source or one drain region each lateral side of which is free of obtuse angles, the source or the drain region can be divided into n individual rectangular regions, n being greater than or equal to 1, each individual region having an individual width $W_i$ and an individual edge at an individual distance $a_i$ in the direction of the length of the channel from the gate, and a corresponding one of the first and the second geometrical parameters $a_s$ and $a_d$ is equal to:

$$W \Big/ \left( \sum_{i=1}^{n} W_i / a_i \right)$$

where W is a width of the channel of the transistor.

7. The method according to claim 4, wherein the useful active area of the transistor includes at least one source or one drain region at least one lateral side of which has at least one obtuse angle, and the corresponding one of the geometrical parameters $a_s$ and $a_d$ is made equal to infinity.

8. The method according to claim 1, further comprising:

defining a useful active area of the transistor as some or the whole of the active area, wherein the useful active area is defined as being a portion of the active area contained within a rectangle whose lateral dimension in a direction of a width of the channel is equal to the width of the channel and each edge of which in the direction of the length of the channel is at a predetermined limit distance from a corresponding flank of the gate.

9. The method according to claim 8, wherein the useful active area of the transistor includes geometrically different source and drain regions, the method further includes defining a first geometrical parameter $a_s$ representing a first distance in the direction of the length of the channel between the gate and the edge of the source region and a second geometrical parameter $a_d$ representing a second distance in the direction of the length of the channel between the gate and the edge of the drain region, the stress parameter is defined using an equation linking the first geometrical parameter and the second geometrical parameter, the useful active area of the transistor includes at least one source or one drain region each lateral side of which is free of obtuse angles, the source or the drain region can be divided into n individual rectangular regions, n being greater than or equal to 1, each individual region having an individual width $W_i$ and an individual edge at an individual distance $a_i$ in the direction of the length of the channel from the gate, a corresponding one of the first and the second geometrical parameters $a_s$ and $a_d$ is equal to:

$$W \Big/ \left( \sum_{i=1}^{n} W_i / a_i \right)$$

where W is the width of the channel of the transistor, and if an individual distance $a_i$ is equal to the limit distance it is considered to be equal to infinity.

10. The method according to claim 8, wherein the limit distance is of the order of ten times a required minimum distance for a contact terminal in the useful active area.

11. The method according to claim 1, wherein the at least one electrical parameter includes a low-field carrier mobility at room temperature, a threshold voltage and a drain/source resistance.

12. The method according to claim 1, further comprising injecting the at least one electrical parameter that was determined into a standard transistor model.

13. The method according to claim 1, wherein the outputting the at least one electrical parameter of the transistor comprises outputting a model of the integrated circuit that is based on a value of the at least one electrical parameter of the transistor.

14. The method according to claim 1, wherein the outputting of the at least one electrical parameter of the transistor comprises supplying the at least one electrical parameter as an input to a simulation model that calculates other electrical parameters of the transistor.

15. The method according to claim 1, further comprising:

receiving a layout diagram of the transistor, wherein defining comprises producing the stress parameter from the layout diagram of the transistor.

16. A system for modeling an integrated circuit including at least one insulated-gate field-effect transistor, said system comprising:

a processor for implementing a program of instructions;

a memory for storing the program of instructions;

generator means configured to define a stress parameter representing mechanical stresses applied to an active area of the transistor;

processing means being configured to determine at least one electrical parameters of the transistor at least partially based on the stress parameter; and output means for outputting the at least one electrical parameter of the transistor to a tangible computer readable medium or display, wherein the stress parameter comprises an equivalent geometrical parameter; and wherein the processing means is configured to determine the at least one electrical parameter of the transistor using an equation involving at least:

the at least one electrical parameter determined for a reference distance, the reference distance, the stress parameter of the transistor, and a coefficient associated with the at least one electrical parameter and depending on a width and a length of a channel of the transistor.

17. The system according to claim 16, wherein the generator means is configured to define a useful active area of the transistor as some or the whole of the active area, and the stress parameter represents at least one distance in a direction of the length of the channel of the transistor between a gate of the transistor and an edge of the useful active area.

18. The system according to claim 16,
wherein the generator means is configured to define a useful active area of the transistor as some or the whole of the active area,
the useful active area of the transistor is rectangular and the gate is centered in the useful active area to define geometrically identical source and drain regions, and
the generator means is configured to define the stress parameter as the distance in the direction of the length of the channel between a flank of the gate and a corresponding edge of the source or the drain region.

19. The system according to claim 16,
wherein the generator means is configured to define a useful active area of the transistor as some or the whole of the active area,
the useful active area of the transistor includes geometrically different source and drain regions,
the generator means is configured to define a first geometrical parameter $a_s$ representing a first distance in the direction of the length of the channel between the gate and the edge of the source region and a second geometrical parameter $a_d$ representing a second distance in the direction of the length of the channel between the gate and the edge of the drain region, and
the generator means is configured to define the stress parameter using an equation linking the first geometrical parameter and the second geometrical parameter.

20. The system according to claim 19, wherein the stress parameter is equal to:

$$1/(\tfrac{1}{2}a_s + \tfrac{1}{2}a_d).$$

21. The system according to claim 19,
wherein the useful active area of the transistor includes at least one source or one drain region each lateral side of which is free of obtuse angles,
the source or the drain region can be divided into n individual rectangular regions, n being greater than or equal to 1, each individual region having an individual width $W_i$ and an individual edge at an individual distance $a_i$ in the direction of the length of the channel from the gate, and
a corresponding one of the first and the second geometrical parameters $a_s$ and $a_d$ is equal to:

$$W \bigg/ \left( \sum_{i=1}^{n} W_i / a_i \right)$$

where W is a width of the channel of the transistor.

22. The system according to claim 19,
wherein the useful active area of the transistor includes at least one source or one drain region at least one lateral side of which has at least one obtuse angle, and
the corresponding one of the geometrical parameters $a_s$ and $a_d$ is made equal to infinity.

23. The method according to claim 16,
wherein the generator means is configured to define a useful active area of the transistor as some or the whole of the active area, and
the useful active area is defined as being a portion of the active area contained within a rectangle whose lateral dimension in a direction of a width of the channel is equal to the width of the channel and each edge of which in the direction of the length of the channel is at a predetermined limit distance from a corresponding flank of the gate.

24. The system according to claim 23,
wherein the useful active area of the transistor includes geometrically different source and drain regions,
the generator means is configured to define a first geometrical parameter $a_s$ representing a first distance in the direction of the length of the channel between the gate and the edge of the source region and a second geometrical parameter $a_d$ representing a second distance in the direction of the length of the channel between the gate and the edge of the drain region,
the generator means is configured to define the stress parameter using an equation linking the first geometrical parameter and the second geometrical parameter,
the useful active area of the transistor includes at least one source or one drain region each lateral side of which is free of obtuse angles,
the source or the drain region can be divided into n individual rectangular regions, n being greater than or equal to 1, each individual region having an individual width $W_i$ and an individual edge at an individual distance $a_i$ in the direction of the length of the channel from the gate,
a corresponding one of the first and the second geometrical parameters $a_s$ and $a_d$ is equal to:

$$W \bigg/ \left( \sum_{i=1}^{n} W_i / a_i \right)$$

where W is the width of the channel of the transistor, and if an individual distance $a_i$ is equal to the limit distance it is considered to be equal to infinity.

25. The system according to claim 23, wherein the limit distance is of the order of ten times a required minimum distance for a contact terminal in the useful active area.

26. The system according to claim 16, wherein the at least one electrical parameter includes a low-field carrier mobility at room temperature, a threshold voltage and a drain/source resistance.

27. The system according to claim 16, wherein the processing means is configured to calculate the at least one electrical parameter using the stress parameter and a standard transistor model.

28. A computer implemented method of producing an integrated circuit including at least one insulated-gate field-effect transistor, said method comprising:
determining at least one electrical parameter of the transistor using a modeling method that includes:
defining a stress parameter representing mechanical stresses applied to an active area of the transistor wherein the stress parameter comprises an equivalent geometrical parameter;
determining the least one electrical parameter of the transistor taking into account the stress parameter;
defining a geometry of the active area of the transistor based on a value of the at least one electrical parameter; and
fabricating the transistor such that the active area of the transistor has the geometry that was defined,
producing the integrated circuit including the transistor, the active area of the transistor having the geometry that was defined;

wherein the determining the at least one electrical parameter of the transistor is performed using an equation involving at least:

the at least one electrical parameter determined for a reference distance, the reference distance, the stress parameter of the transistor, and a coefficient associated with the at least one electrical parameter and depending on a width and a length of a channel of the transistor.

29. The method according to claim 28, wherein a useful active area of the transistor is defined as some or the whole of the active area, and the stress parameter represents at least one distance in a direction of the length of the channel of the transistor between a gate of the transistor and an edge of the useful active area.

30. The method according to claim 29, wherein the transistor is an NMOS transistor and the equivalent geometrical parameter is greater than twice a required minimum distance for a contact terminal in the active area.

31. The method according to claim 30, wherein the integrated circuit includes at least one block including a plurality of NMOS transistors and more than 80% of the NMOS transistors have their equivalent geometrical parameter greater than twice the minimum distance.

32. The method according to claim 29, wherein the transistor is a PMOS transistor and the equivalent geometrical parameter is less than twice a required minimum distance for a contact terminal in the active area.

33. The method according to claim 32, wherein the integrated circuit includes at least one block including a plurality of PMOS transistors and more than 80% of the PMOS transistors have their equivalent geometrical parameter less than twice the minimum distance.

34. The method according to claim 28, wherein the at least one electrical parameters includes a low-field carrier mobility at room temperature, a threshold voltage and a drain/source resistance.

35. An integrated circuit including at least one insulated-gate field-effect transistor comprising:

an active area of the transistor including a useful active area defined as a portion or the whole of the active area of the transistor;

a distance $a_{eq}$ in a direction of a length of a channel of the transistor between a gate of the transistor and an edge of the useful active area is different from a required minimum distance $a_{min}$ for a contact terminal on the active area; and a geometry of the active area of the transistor defined based on a value of at least one electrical parameter, wherein the electrical parameter is determined taking into account a stress parameter representing mechanical stress applied to the active area of the transistor, wherein the stress parameter represents the distance in the direction of the length of the channel of the transistor between the gate of the transistor and the edge of the useful active area; and the transistor fabricated such that the active area has the geometry so defined.

36. The integrated circuit according to claim 35, wherein the transistor is an NMOS transistor and the distance $a_{eq}$ is greater than twice the minimum distance $a_{min}$.

37. The integrated circuit according to claim 36, wherein the integrated circuit includes at least one block including a plurality of NMOS transistors and more than 80% of the NMOS transistors have their equivalent geometrical parameter $a_{eq}$ greater than twice the minimum distance $a_{min}$.

38. The integrated circuit according to claim 35, wherein the transistor is a PMOS transistor and the distance $a_{eq}$ is less than twice the minimum distance $a_{min}$.

39. The integrated circuit according to claim 38, wherein the integrated circuit includes at least one block including a plurality of PMOS transistors and more than 80% of the PMOS transistors have their distance $a_{eq}$ less than twice the minimum distance $a_{min}$.

40. The integrated circuit according to claim 35, wherein the useful active area is the portion of the active area within a rectangle whose lateral dimension in a direction of a width of the channel is equal to the width of the channel and each edge of which in the direction of the length of the channel is at a predetermined limit distance from a corresponding flank of the gate.

41. The integrated circuit according to claim 40, wherein the limit distance is of the order of ten times the required minimum distance $a_{min}$.

42. A computer readable storage medium comprising a program of computer executable instructions for modeling an integrated circuit including at least one insulated-gate field-effect transistor, said program including instructions for:

defining a stress parameter representing mechanical stresses applied to an active area of the transistor;

determining at least one electrical parameter of the transistor taking into account the stress parameter; and outputting the at least one electrical parameter to a tangible computer readable medium or display, wherein the stress parameter comprises an equivalent geometrical parameter; and wherein the determining the at least one electrical parameter of the transistor is performed using an equation involving at least:

the at least one electrical parameter determined for a reference distance, the reference distance, the stress parameter of the transistor, and a coefficient associated with the at least one electrical parameter and depending on a width and a length of a channel of the transistor.

43. A computer implemented method of modeling an integrated circuit including at least one insulated-gate field-effect transistor, said method including:

defining a stress parameter representing mechanical stresses applied to an active area of the transistor, the stress parameter comprising an equivalent geometrical parameter;

defining a useful active area of the transistor as some or the whole of the active area, the stress parameter representing at least one distance in a direction of a length of a channel of the transistor between a gate of the transistor and an edge of the useful active area;

determining at least one electrical parameter of the transistor taking into account the stress parameter; and outputting the at least one electrical parameter of the transistor to a tangible computer readable medium or display.

44. The method according to claim 43, wherein the useful active area of the transistor is rectangular and the gate is centered in the useful active area to define geometrically identical source and drain regions, and the stress parameter is defined as the distance in the direction of the length of the channel between a flank of the gate and a corresponding edge of the source or the drain region.

45. The method according to claim 43,
wherein the useful active area of the transistor includes geometrically different source and drain regions,
the method further includes defining a first geometrical parameter $a_s$ representing a first distance in the direction of the length of the channel between the gate and the edge of the source region and a second geometrical parameter $a_d$ representing a second distance in the direction of the length of the channel between the gate and the edge of the drain region, and
the stress parameter is defined using an equation linking the first geometrical parameter and the second geometrical parameter.

46. The method according to claim 45, wherein the stress parameter is defined as being equal to:

$1/(\tfrac{1}{2}a_s + \tfrac{1}{2}a_d)$.

47. The method according to claim 45,
wherein the useful active area of the transistor includes at least one source or one drain region each lateral side of which is free of obtuse angles, the source or the drain region can be divided into n individual rectangular regions, n being greater than or equal to 1, each individual region having an individual width $W_i$ and an individual edge at an individual distance $a_i$ in the direction of the length of the channel from the gate, and
a corresponding one of the first and the second geometrical parameters $a_s$ and $a_d$ is equal to:

$$W \Big/ \left( \sum_{i=1}^{n} W_i / a_i \right)$$

where W is a width of the channel of the transistor.

48. The method according to claim 45,
wherein the useful active area of the transistor includes at least one source or one drain region at least one lateral side of which has at least one obtuse angle, and
the corresponding one of the geometrical parameters $a_s$ and $a_d$ is made equal to infinity.

49. The method according to claim 43, wherein the useful active area is defined as being a portion of the active area contained within a rectangle whose lateral dimension in a direction of a width of the channel is equal to the width of the channel and each edge of which in the direction of the length of the channel is at a predetermined limit distance from a corresponding flank of the gate.

50. The method according to claim 49,
wherein the useful active area of the transistor includes geometrically different source and drain regions,
the method further includes defining a first geometrical parameter $a_s$ representing a first distance in the direction of the length of the channel between the gate and the edge of the source region and a second geometrical parameter $a_d$ representing a second distance in the direction of the length of the channel between the gate and the edge of the drain region,
the stress parameter is defined using an equation linking the first geometrical parameter and the second geometrical parameter, the useful active area of the transistor includes at least one source or one drain region each lateral side of which is free of obtuse angles,
the source or the drain region can be divided into n individual rectangular regions, n being greater than or equal to 1, each individual region having an individual width $W_i$ and an individual edge at an individual distance $a_i$ in the direction of the length of the channel from the gate, and
a corresponding one of the first and the second geometrical parameters $a_s$ and $a_d$ is equal to:

$$W \Big/ \left( \sum_{i=1}^{n} W_i / a_i \right)$$

where W is the width of the channel of the transistor, and if an individual distance $a_i$ is equal to the limit distance it is considered to be equal to infinity.

51. The method according to claim 49, wherein the limit distance is of the order of ten times a required minimum distance for a contact terminal in the useful active area.

52. The method according to claim 43, wherein the at least one electrical parameter includes low-field carrier mobility at room temperature, a threshold voltage and a drain source resistance.

53. The method according to claim 43, further comprising injecting the at least one electrical parameter that was determined into a standard transistor model.

54. The method according to claim 43, wherein the outputting the at least one electrical parameter of the transistor comprises outputting a model of the integrated circuit that is based on a value of the at least one electrical parameter of the transistor.

55. The method according to claim 43, wherein the outputting of the at least one electrical parameter of the transistor comprises supplying the at least one electrical parameter as an input to a simulation model that calculates other electrical parameters of the transistor.

56. The method according to claim 43, further comprising:
receiving a layout diagram of the transistor,
wherein defining the stress parameter comprises producing the stress parameter from the layout diagram of the transistor.

57. A system for modeling an integrated circuit including at least one insulated-gate field-effect transistor, said system comprising:
a processor for implementing a program of instructions;
a memory for storing the program of instructions;
generator means configured to define a stress parameter representing mechanical stresses applied to an active area of the transistor, the stress parameter comprising an equivalent geometrical parameter;
processing means being configured to determine at least one electrical parameter of the transistor at least partially based on the stress parameter; and
output means for outputting the at least one electrical parameter of the transistor to a tangible computer readable medium or display,
wherein the generator means is configured to define a useful active area as some or the whole of the active area, and
the stress parameter represents at least one distance in a direction of a length of a channel of the transistor between a gate of the transistor and an edge of the useful active area.

58. The system according to claim 57,
wherein the useful active area of the transistor is rectangular and the gate is centered in the useful active area to define geometrically identical source and drain regions, and
the generator means is configured to define the stress parameter as the distance in the direction of the length of the channel between a flank of the gate and a corresponding edge of the source or the drain region.

59. The system according to claim 57,
wherein the useful active area of the transistor includes geometrically different source and drain regions, the generator means is configured to define a first geometrical parameter $a_s$ representing a first distance in the direction of the length of the channel between the gate and the edge of the source region and a second geometrical parameter $a_d$ representing a second distance in the direction of the length of the channel between the gate and the edge of the drain region, and
the generator means is configured to define the stress parameter from an equation linking the first geometrical parameter and the second geometrical parameter.

60. The system according to claim 59, wherein the stress parameter is equal to:

$1/(\frac{1}{2}a_s + \frac{1}{2}a_d)$.

61. The system according to claim 59,
wherein the useful active area of the transistor includes at least one source or one drain region each lateral side of which is free of obtuse angles,
the source or the drain region can be divided into n individual rectangular regions, n being greater than or equal to 1, each individual region having an individual width $W_i$ and an individual edge at an individual distance $a_i$ in the direction of the length of the channel from the gate, and
a corresponding one of the first and the second geometrical parameters $a_s$ and $a_d$ is equal to:

$$W \bigg/ \left(\sum_{i=1}^{n} W_i / a_i\right)$$

where W is a width of the channel of the transistor.

62. The system according to claim 59,
wherein the useful active area of the transistor includes at least one source or one drain region at least one lateral side of which has at least one obtuse angle, and
the corresponding one of the geometrical parameters $a_s$ and $a_d$ is made equal to infinity.

63. The system according to claim 57, wherein the useful active area is defined as being a portion of the active area contained within a rectangle whose lateral dimension in a direction of a width of the channel is equal to the width of the channel and each edge of which in the direction of the length of the channel is at a predetermined limit distance from a corresponding flank of the gate.

64. The system according to claim 63,
wherein the useful active area of the transistor includes geometrically different source and drain regions, the generator means is configured to define a first geometrical parameter $a_s$ representing a first distance in the direction of the length of the channel between the gate and the edge of the source region and a second geometrical parameter $a_d$ representing a second distance in the direction of the length of the channel between the gate and the edge of the drain region,
the generator means is configured to define the stress parameter using an equation linking the first geometrical parameter and the second geometrical parameter,
the useful active area of the transistor includes at least one source or one drain region each lateral side of which is free of obtuse angles,
the source or the drain region can be divided into n individual rectangular regions, n being greater than or equal to i, each individual region having an individual width $W_i$ and an individual edge at an individual distance $a_i$ in the direction of the length of the channel from the gate, and
a corresponding one of the first and the second geometrical parameters $a_s$ and $a_d$ is equal to:

$$W \bigg/ \left(\sum_{i=1}^{n} W_i / a_i\right)$$

where W is the width of the channel of the transistor, and if an individual distance $a_i$ is equal to the limit distance it is considered to be equal to infinity.

65. The system according to claim 63, wherein the limit distance is of the order of ten times a required minimum distance for a contact terminal in the useful active area.

66. The system according to claim 57, wherein the at least one electrical parameter includes a low-field carrier mobility at room temperature, a threshold voltage and a drain/source resistance.

67. The system according to claim 57, wherein the processing means is configured to calculate the at least one electrical parameter using the stress parameter and a standard transistor model.

68. A computer implemented method of producing an integrated circuit including at least one insulated-gate field-effect transistor, said method comprising:
determining at least one electrical parameter of the transistor using a modeling method that includes:
defining a stress parameter representing mechanical stresses applied to an active area of the transistor, the stress parameter comprising an equivalent geometrical parameter;
defining a useful active area of the transistor as some or the whole of the active area, the stress parameter representing at least one distance in a direction of a length of a channel of the transistor between a gate of the transistor and an edge of the useful active area; and
determining the least one electrical parameter of the transistor taking into account the stress parameter;
defining a geometry of the active area of the transistor based on a value of the at least one electrical parameter;
fabricating the transistor such that the active area of the transistor has the geometry that was defined; and
producing the integrated circuit including the transistor, the active area of the transistor having the geometry that was defined.

69. The method according to claim 68, wherein the at least one electrical parameter includes a low-field carrier mobility at room temperature, a threshold voltage and a drain/source resistance.

70. The method according to claim 68, wherein the transistor is an NMOS transistor and the equivalent geometrical parameter is greater than twice a required minimum distance for a contact terminal in the active area.

71. The method according to claim 70, wherein the integrated circuit includes at least one block including a plurality of NMOS transistors and more than 80% of the NMOS transistors have their equivalent geometrical parameter greater than twice the minimum distance.

72. The method according to claim 68, wherein the transistor is a PMOS transistor and the equivalent geometrical parameter is less than twice a required minimum distance for a contact terminal in the active area.

73. The method according to claim 72, wherein the integrated circuit includes at least one block including a plurality of PMOS transistors and more than 80% of the PMOS transistors have their equivalent geometrical parameter less than twice the minimum distance.

74. A computer readable storage medium comprising a program of computer executable instructions for modeling an integrated circuit including at least one insulated-gate field-effect transistor, said program including instructions for:
   defining a stress parameter representing mechanical stresses applied to an active area of the transistor, the stress parameter comprising an equivalent geometrical parameter;
   defining a useful active area of the transistor as some or the whole of the active area, the stress parameter representing at least one distance in a direction of a length of a channel of the transistor between a gate of the transistor and an edge of the useful active area;
   determining at least one electrical parameter of the transistor taking into account the stress parameter; and
   outputting the at least one electrical parameter to a tangible computer readable medium or display.

75. A computer implemented method of modeling an integrated circuit including at least one insulated-gate field-effect transistor, said method including:
   receiving a layout diagram of the transistor;
   defining a stress parameter representing mechanical stresses applied to an active area of the transistor the stress parameter comprising an equivalent geometrical parameter;
   defining a useful active area of the transistor as some or the whole of the active area, the stress parameter representing at least one distance in a direction of a length of a channel of the transistor between a gate of the transistor and an edge of the useful active area;
   determining at least one electrical parameter of the transistor taking into account the stress parameter; and
   outputting the at least one electrical parameter to a tangible computer readable medium or display,
   wherein defining the stress parameter comprises producing the stress parameter from the layout diagram of the transistor.

* * * * *